(12) United States Patent
Carter et al.

(10) Patent No.: US 7,933,136 B2
(45) Date of Patent: Apr. 26, 2011

(54) NON-VOLATILE MEMORY CELL WITH MULTIPLE RESISTIVE SENSE ELEMENTS SHARING A COMMON SWITCHING DEVICE

(75) Inventors: Andrew John Carter, Minneapolis, MN (US); Maroun Georges Khoury, Burnsville, MN (US); Yong Lu, Edina, MN (US); Roger Glenn Rolbiecki, Shoreview, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 157 days.

(21) Appl. No.: 12/424,065

(22) Filed: Apr. 15, 2009

(65) Prior Publication Data

US 2010/0118589 A1 May 13, 2010

Related U.S. Application Data

(60) Provisional application No. 61/112,269, filed on Nov. 7, 2008.

(51) Int. Cl.
*G11C 5/06* (2006.01)
(52) U.S. Cl. ............ 365/63; 365/51; 365/148; 365/158; 365/163; 365/171

(58) Field of Classification Search .................... 365/63, 365/51, 148, 158, 163, 171
See application file for complete search history.

(56) References Cited

U.S. PATENT DOCUMENTS

| | | | |
|---|---|---|---|
| 5,083,190 A | 1/1992 | Pfiester | |
| 7,009,877 B1 | 3/2006 | Huai et al. | |
| 7,205,614 B2 * | 4/2007 | Young et al. | 257/367 |
| 7,215,568 B2 | 5/2007 | Liaw et al. | |
| 7,440,317 B2 | 10/2008 | Bhattacharyya | |
| 7,459,717 B2 * | 12/2008 | Lung | 257/4 |
| 7,529,114 B2 * | 5/2009 | Asao | 365/63 |
| 7,791,057 B2 * | 9/2010 | Lung et al. | 257/2 |
| 2005/0253143 A1 | 11/2005 | Takaura et al. | |

OTHER PUBLICATIONS

Giacomini, R. and Martino, J.A., "Modeling Silicon on Insulator MOS Transistors with Nonrectangular-Gate Layouts," Journal of the Electrochemical Society, 2006, pp. G218-G222, vol. 153, No. 3.

\* cited by examiner

*Primary Examiner* — VanThu Nguyen
(74) *Attorney, Agent, or Firm* — Fellers, Snider, et al.

(57) ABSTRACT

A non-volatile memory cell array and associated method of use. In accordance with various embodiments, the array includes a plurality of programmable resistive sense elements (RSEs) coupled to a shared switching device. The switching device has a common source region and multiple drain regions, each drain region connected to an associated RSE from said plurality of RSEs.

20 Claims, 5 Drawing Sheets

NON-VOLATILE MEMORY CELL WITH MULTIPLE RESISTIVE SENSE ELEMENTS SHARING A COMMON SWITCHING DEVICE

RELATED APPLICATIONS

This application makes a claim of domestic priority under 35 U.S.C. §119(e) to U.S. Provisional Patent Application No. 61/112,269 filed Nov. 7, 2008.

BACKGROUND

Data storage devices can be used to store and retrieve user data in a fast and effective manner. Some data storage devices utilize a semiconductor array of solid-state memory cells to store data. The memory cells can be volatile or non-volatile. Some non-volatile memory cells can be provided with a 1T1R configuration with a single transistor ("T") and a single programmable resistive sense element ("R").

The resistive sense element is programmable to different resistive states through the application of write currents to the memory cell, and these different resistive states can be used to denote different logical states (e.g., logical 0, 1, 10, etc.). The programmed state of the resistive sense element can be sensed using a sense amplifier to detect a voltage generated by passage of a read current through the memory cell. A number of resistive sense element (RSE) constructions are known, including without limitation magnetic random access memory (MRAM), spin-torque transfer random access memory (STRAM), resistive random access memory (RRAM), phase change random access memory (PCRAM), and programmable metallic cells (PMCs).

The memory cell transistor serves as a switching device to facilitate access to the memory cell during write and read operations, and to decouple the memory cell from adjacent cells at other times. The cell transistor may be realized as an n-channel metal oxide semiconductor field effect transistor (NMOSFET).

The cell transistor will be sized to accommodate the relatively large write currents used to program the RSE to different resistive states, and can require a substantially greater semiconductor area than the associated RSE in the cell. The size of the cell transistor can thus serve as a limiting factor in achieving greater areal data storage densities in a semiconductor array.

SUMMARY

Various embodiments of the present invention are directed to a non-volatile memory cell array and method of use therefor.

In accordance with some embodiments, the array comprises a plurality of programmable resistive sense elements (RSEs) coupled to a shared switching device. The switching device comprises a common source region and multiple drain regions, each drain region connected to an associated RSE from said plurality of RSEs.

In accordance with other embodiments, the method generally comprises providing a plurality of programmable resistive sense elements (RSEs) coupled to a shared switching device. The switching device comprises a common source region and multiple drain regions, each drain region connected to an associated RSE from said plurality of RSEs. A selected RSE from said plurality of RSEs is programmed by passing a write current in a selected direction between the common source region to the associated drain region connected to the selected RSE.

These and other features and advantages which characterize the various embodiments of the present invention can be understood in view of the following detailed discussion and the accompanying drawings.

DETAILED DESCRIPTION

Figure 1:
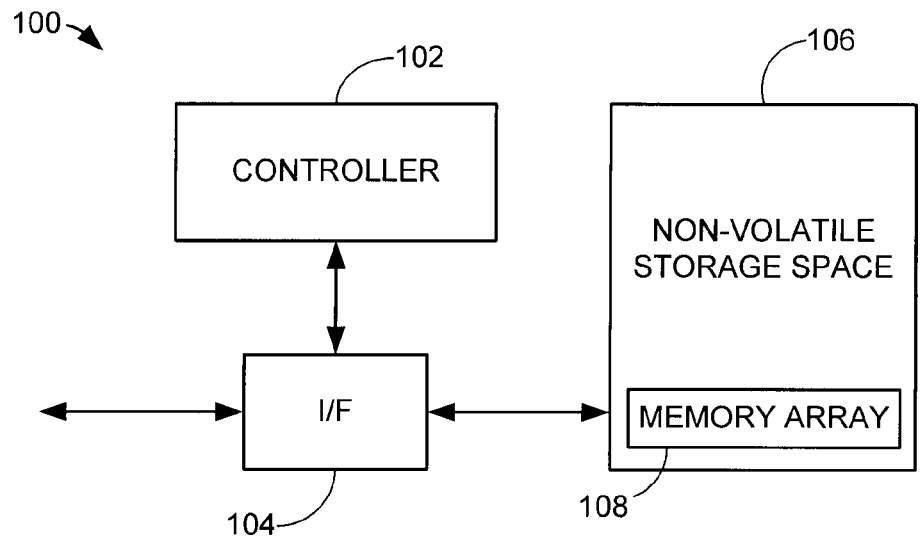
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention.

Top level control of the device 100 in FIG. 1 is carried out by a controller 102, which may be a programmable or hardware based microcontroller. The controller 102 communicates with a host device via a controller interface (I/F) circuit 104. A memory space 106 comprises a number of memory arrays 108 (denoted Array 0-N). Each array 108 comprises a block of semiconductor memory of selected storage capacity. A single array 108 can alternately be used.

Figure 2:
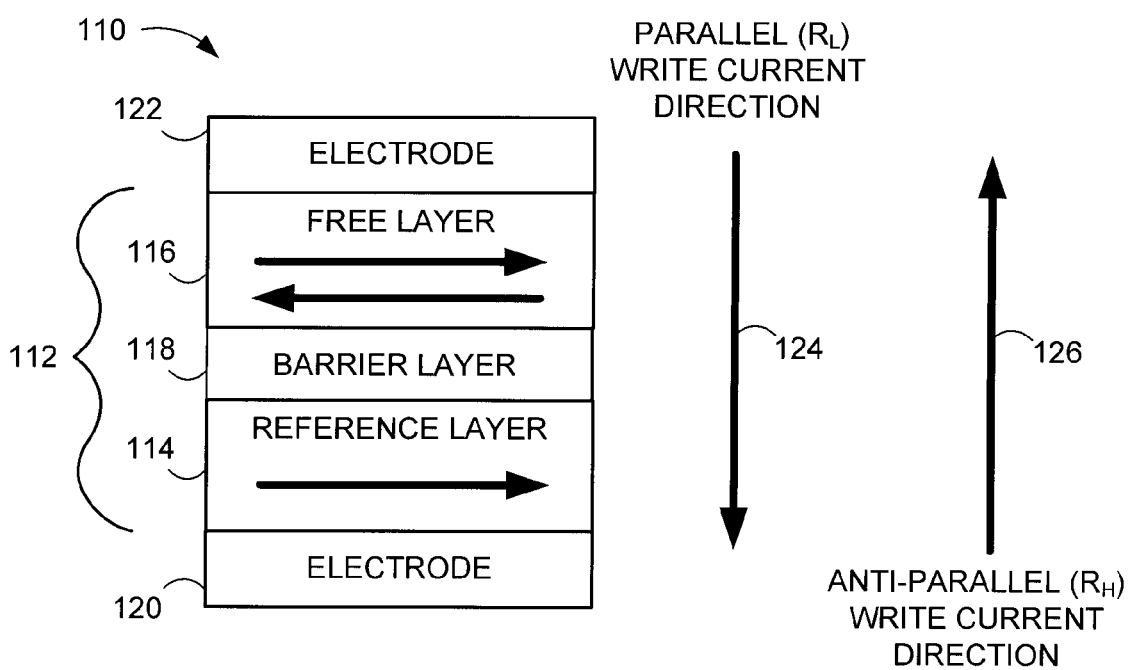
FIG. 2 shows an exemplary construction for a resistive sense element (RSE) of the memory array of FIG. 1 in accordance with some embodiments.

FIG. 2 shows a resistive sense element (RSE) 110 used in various memory cells of the memory space 106 to store data. The RSE 110 is characterized in FIG. 2 as a spin-torque transfer random access memory (STRAM), although other RSE constructions can be used. The STRAM RSE includes a magnetic tunneling junction (MTJ) 112 with a fixed reference layer 114, a free layer 116 and a tunneling barrier layer 118. The MTJ 112 is bounded by electrodes 120, 122. In some embodiments, the electrodes comprise spin polarizing material that uniformly orients the spin of current passing through the RSE MTJ 112.

The reference layer 114 has a fixed magnetic orientation in a selected direction. This fixed magnetic orientation can be established in a number of ways, such as via pinning to a separate magnet (not shown). The free layer 116 has a selectively programmable magnetic orientation that can be parallel or anti-parallel with the selected direction of the reference layer 114. Other respective magnetization orientations can be used, such as orientations substantially perpendicular to those shown in FIG. 2.

A low resistance state for the MTJ 112 is achieved when the magnetization of the free layer 116 is oriented to be substantially in the same direction (parallel) as the magnetization of the reference layer 114. To orient the MTJ 112 in the parallel low resistance state, a write current 124 passes through the MTJ 112 so that the magnetization direction of the reference layer 114 sets the magnetic orientation of the free layer 116. Since electrons flow in the direction opposite to the direction of current, the write current direction passes from the free layer 116 to the reference layer 114, and the electrons travel from the reference layer 114 to the free layer 116.

A high resistance state for the MTJ 112 is established in the anti-parallel orientation in which the magnetization direction of the free layer 116 is substantially opposite that of the reference layer 114. To orient the MTJ 112 in the anti-parallel resistance state, a write current 126 passes through the MTJ 112 from the reference layer 114 to the free layer 116 so that spin-polarized electrons flow into the free layer 116 in the opposite direction.

A different logical state is assigned to each of the programmable resistances of the MTJ. In some embodiments, the low resistance, parallel state is used to represent a logical 0, and the high resistance, anti-parallel state is used to represent a logical 1. Additional programmed states can be used when the MTJ is configured to store multiple bits. For example, programmed resistances R1<R2<R3<R4 can be used to respectively store multi-bit values "00," "01," "10" and "11."

Some prior art memory cells combine a single RSE such as 110 with a single switching device, such as a transistor, to form a 1T1R memory cell configuration ("one transistor, one resistor"). The RSE is used to store the memory state of the memory cell, and the transistor is used to facilitate switching access to the RSE. A limitation with this approach is the semiconductor area required for the switching device, which can be substantially larger than that required to form the RSE. Thus, the storage capacity and density of memory cells can be greatly improved by decreasing the area occupied by switching devices.

Accordingly, various embodiments of the present invention are generally directed to a novel memory cell structure in which multiple RSEs are respectively coupled to a single switching device (such as an NMOSFET) to respectively store programmed resistive states. The switching device is provided with a single source region and multiple drain regions, with each drain region coupled to an associated RSE.

The RSEs are accessed by a common source line and a common gate line, and with different, individual bit lines. Since only a single RSE out of the group of RSEs sharing the switching device will be accessed at a given time, the space that would have otherwise been taken up using a single switching device for each RSE is saved, resulting in a significant increase in data storage density. Also, no field oxide or shallow trench isolation areas are needed between adjacent transistors as in the prior art, further leading to higher data storage densities in the array.

Figure 3:
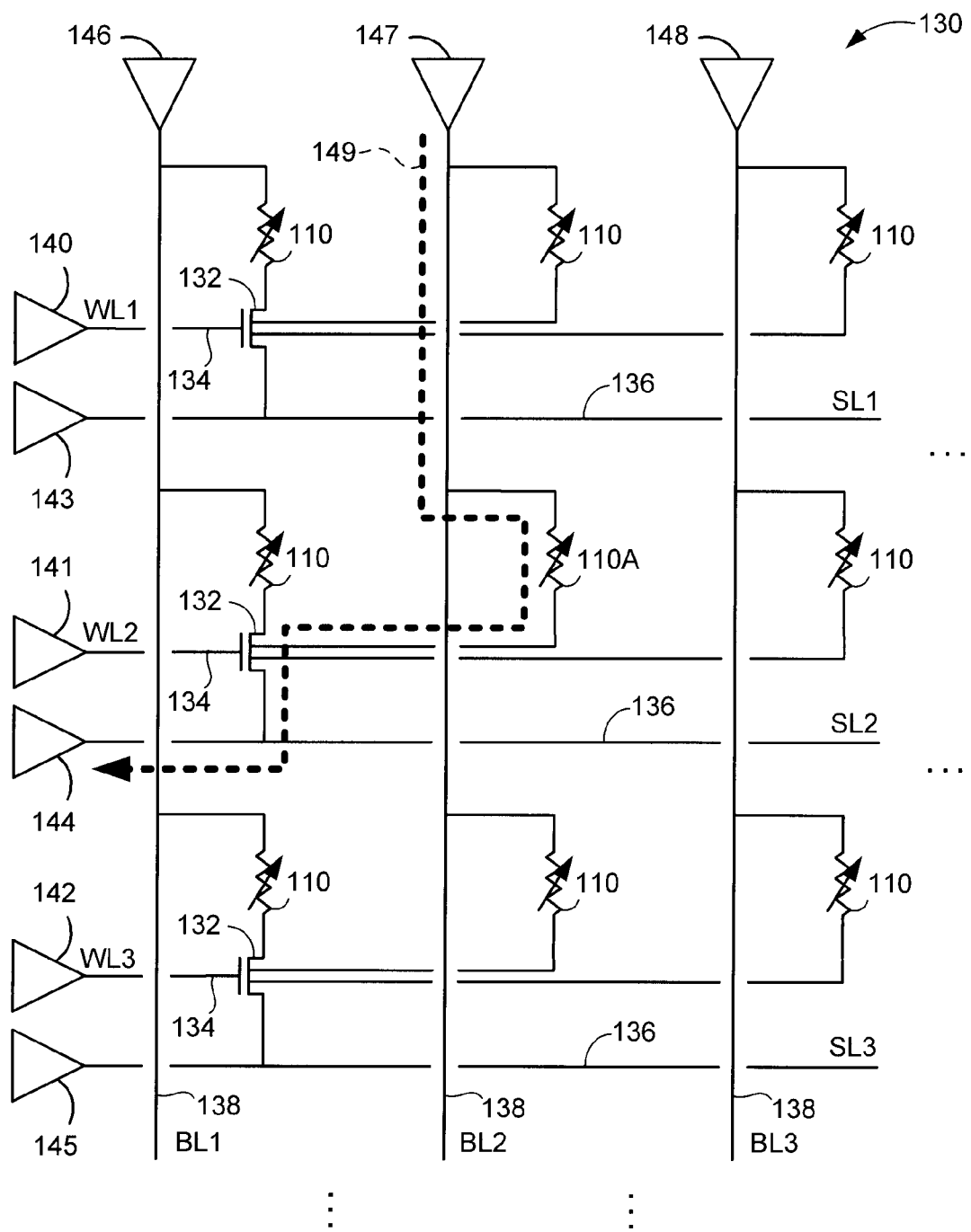
FIG. 3 is a schematic diagram of a number of 1TNR memory cells of the memory array in accordance with various embodiments.

FIG. 3 shows a schematic representation of a number of memory cells 130 in accordance with some embodiments. Each memory cell 130 includes an RSE 110 coupled to a shared switching device 132 (cell transistor). While FIG. 3 shows groups of three RSEs connected to each shared transistor 132, other plural numbers of RSEs can be connected as desired. The RSEs 110 can take an STRAM configuration with MTJs as set forth in FIG. 2, or can take other alternative constructions such as but not limited to resistive random access memory (RRAM) or phase change random access memory (PCRAM).

Each of the RSEs 110 share a common gate control line and source control line of the associated cell transistor 132. These connections are provided via respective word lines 134 (WL1-WL3) and source lines 136 (SL1-SL3). Individual bit lines 138 are provided for the RSEs 110 (BL1-BL3) in each cell. Respective word line drivers are denoted at 140-142, source line drivers at 143-145, and bit line drivers at 146-148.

The programmed state of the respective RSEs can be written and read by the application of appropriate signal levels to the respective WL, SL and BL for that RSE. For example, the RSE 110A in FIG. 3 can be accessed by the WL2 word line, the SL2 source line and the BL2 bit line. A first write current direction through the RSE 110A is denoted in broken line 149 and originates from the bit line driver 147. A second write current direction opposite the direction 149 can originate from the source line driver 144. A lower magnitude read current can be passed through the RSE 110A in the direction 149 and the voltage at the BL2 bit line can be sensed to read the programmed state of the RSE 110A.

Figure 4:
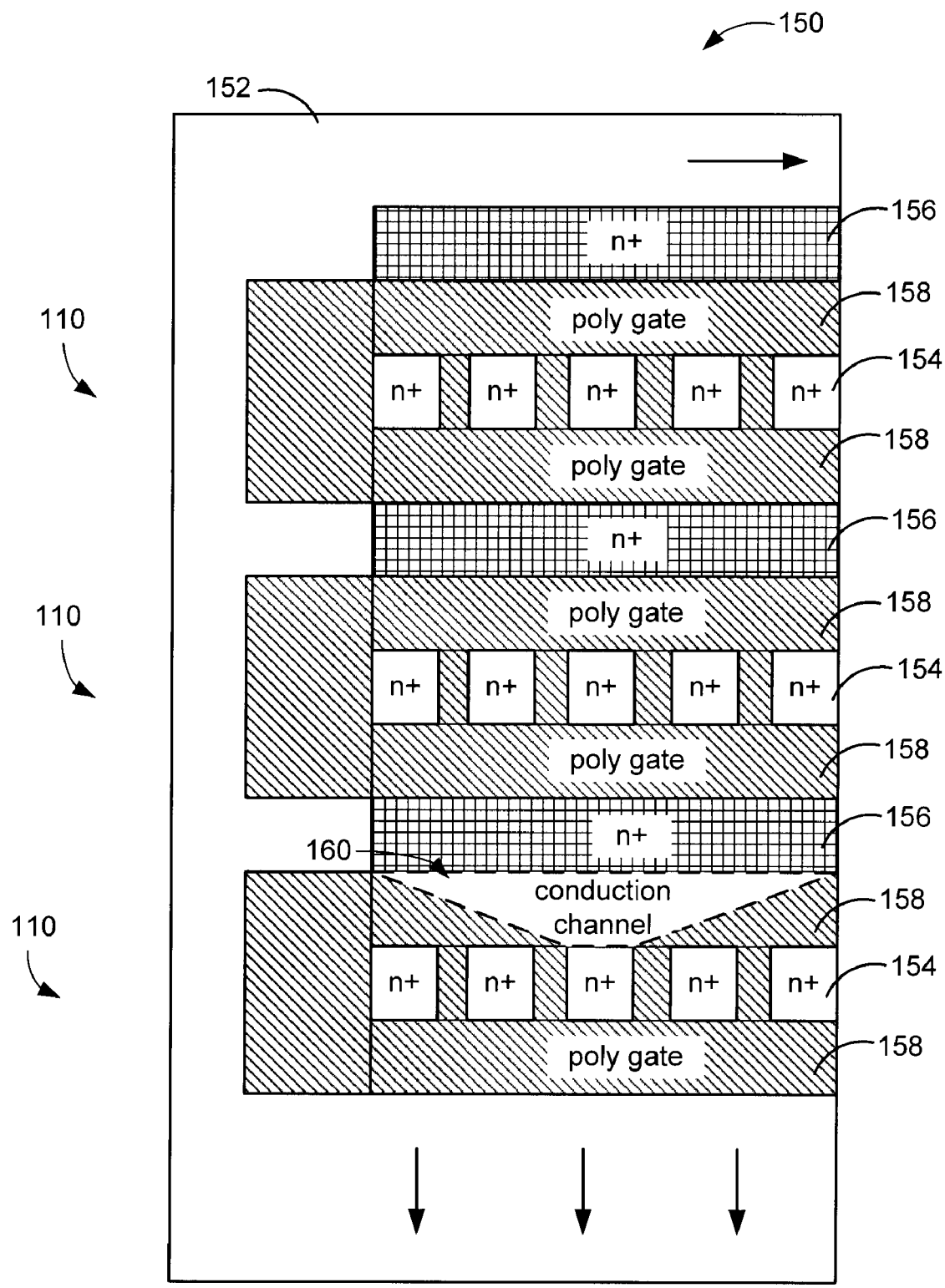
FIG. 4 shows an exemplary physical layout of the memory cells of FIG. 3 prior to metallization processing.

The memory cells 130 in FIG. 3 can be formed using a physical layout as shown in FIG. 4. FIG. 4 shows a memory cell device structure 150 on a substrate 152 prior to metallization processing. In some embodiments, the common switching devices 132 (FIG. 3) are NMOSFETs with N+ doped regions 154 that serve as drain regions which are respectively connected to the associated resistive sense elements (110, FIG. 3). An additional N+ doped region is provided as a common source region (terminal) 156, as shown in FIG. 4. The layout represented by FIG. 4 can be referred to as a harmonica array due to its resemblance to a harmonica.

To connect the individual RSE contact regions 154 with the common source line contact region 156, a polysilicon gate (poly gate) 158 surrounds each contact region 154 and contacts the common source contact region 156. The switching device 132 can thus be characterized as having a common source terminal and a plurality of individual drain terminals (regions 154).

Upon activation of the gate terminal by application of a suitable gate control voltage via the word line (134, FIG. 3), a trapezoidal shaped (source-to-drain) conduction channel through the switching device will be formed in the poly gate 158 to the selected contact region 154, such as represented at 160 of FIG. 4. The trapezoidal shape of the conduction channel will vary depending on which contact region 154 is selected. Because the poly gate region 158 surrounds each drain region 154, a right-angle relationship between the poly and the drain is established, as shown. It is contemplated that a majority of the current will flow along the trapezoidal shaped conduction channel, but other current may flow along the sides of the drain as well.

Figure 5:
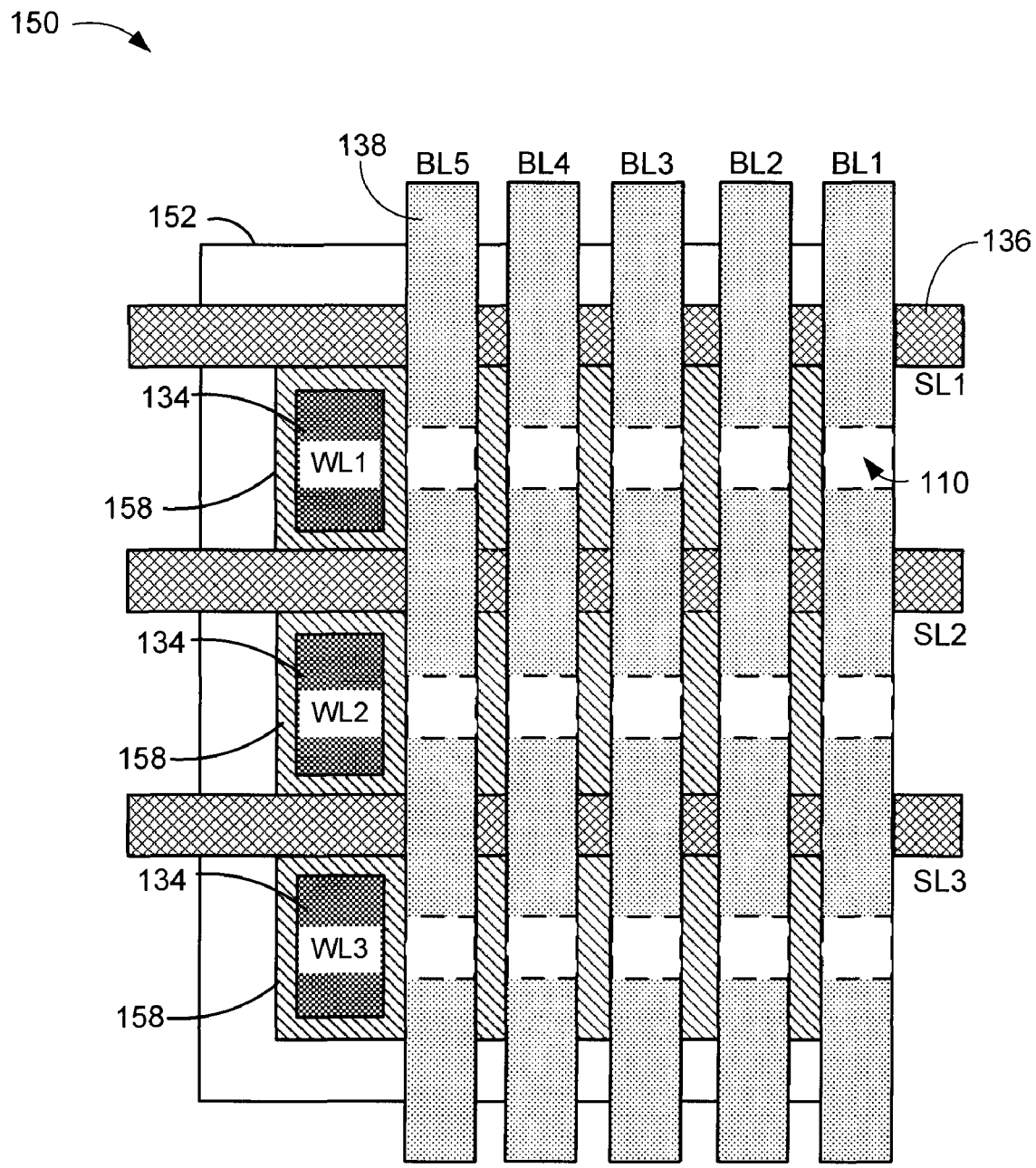
FIG. 5 shows the layout of FIG. 5 after further metallization processing.

FIG. 5 shows a further layout of the device structure 150 of FIG. 4 with additional metallic processing. Additional layers include those forming the RSEs 110, and those forming the various BL, WL and SL control lines. In some embodiments, the bit lines 138 and common source line 136 occupy a common plane parallel to the substrate 152, and the word lines 134 are orthogonal to the substrate, source line, and bit line. As discussed above, the bit lines are positioned to supply current to the RSEs, which are located between the bit lines and the bit contact regions 134 (FIG. 4).

The common source line 136 will match the underlying common source line contact region in an abutting relation so that current can easily be transferred to and from the source line to the polysilicon gate 158. The word line 134 is positioned to contact a portion of the polysilicon gate 158 to allow the selection of the switching device 132 and the initiation of current flow between the selected bit line and the common source line.

The positioning of multiple switching devices in an adjacent relationship is carried out so that the flow of current through one selected resistive sense element will not be altered by the presence of the adjacent switching device. As such, a first poly gate 158 will not interfere or contact the adjacent poly gate regions. This facilitates increased switching device density while providing precise access to a selected resistive sense element. It will be appreciated that the circuitry of FIG. 3 can be realized in an alternative configuration to that depicted in FIGS. 4-5, depending on the requirements of a given application.

Figure 6:
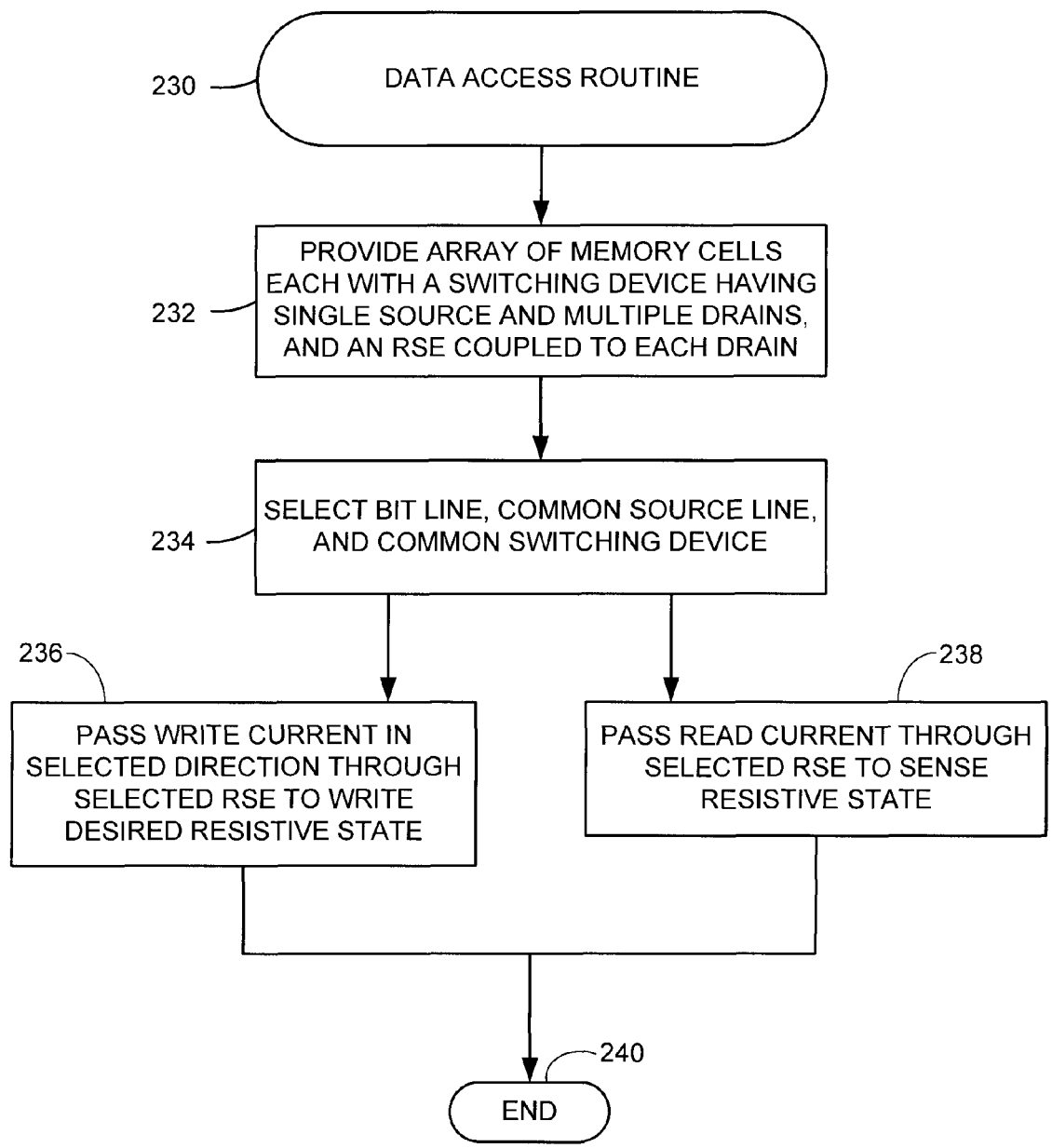
FIG. 6 is a flow chart for a data access routine.

FIG. 6 shows a flowchart of a data access routine 200 carried out in accordance with various embodiments of the present invention with reference to the memory cell 150 generally illustrated in FIG. 4. The data access routine 200 initially provides a memory array with groups of RSEs (memory elements) such as 110 that share a common switching device such as 132, as shown in FIG. 4. In some embodiments, the switching device has a common source region and multiple drain regions each connected to an associated RSE and group of RSEs.

At step 234, a selected RSE is identified by selecting the associated bit line, common source line, and common word line. A write operation is carried out at step 236 to program the RSE to a selected programmed state by passing an appropriate write current in a suitable direction through the RSE. The write current will pass between the common source region 156 and the associated drain region 154, as the write current traverses the switching device. Further in various embodiments, the selected RSE can be programmed with the write current passing between the common source region and the associated drain region connected to the selected RSE.

A read operation is carried out at step 238 to read a programmed state of the selected RSE by passing an appropriate read current through the RSE and sensing a voltage generated thereby. As displayed in FIG. 4, the read current will pass between the common source region 156 and the associated drain region 154 coupled to the selected RSE. The routine then ends at step 240.

As can be appreciated by one skilled in the art, the various embodiments illustrated herein provide advantageous accessing data to and from a resistive sense element in an efficient manner. The use of a common switching device for a plurality of resistive sense elements in a row provide advantageous area savings in practical semiconductor data storage devices. With a plurality of resistive sense elements connected sharing a common source line and gate of the common switching device, an entire array of resistive sense elements can be constructed in-line and without the time consuming process of separating switching devices with field oxide or shallow-trench-isolation. Further, the sharing of switching device gate and source line allows for a single gate to handle enough write current to satisfy any asymmetrical write current needs generated by certain resistive sense elements, such as STRAM cells.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A non-volatile memory cell array comprising a plurality of programmable resistive sense elements (RSEs) coupled to a shared switching device, the switching device comprising a common source region and multiple drain terminals separated from the common source terminal by a polysilicon gate surrounding each drain terminal, each drain terminal connected in series with an associated RSE from said plurality of RSEs.

2. The array of claim 1, wherein a selected RSE is accessed by a common word line connected to a gate terminal of the switching device, a common source line connected to the common source region of the switching device, and a plurality of bit lines, each bit line in said plurality of bit lines connected to a corresponding RSE in said plurality of RSEs.

3. The array of claim 2, wherein a first RSE of said plurality is programmed to a first resistive state by asserting a gate control voltage on the gate terminal of the switching device, and flowing a write current in a first direction between the common source line and a first bit line connected to the first RSE.

4. The array of claim 3, wherein a second RSE of said plurality is programmed to a second resistive state different from the first resistive state by asserting a gate control voltage on the gate terminal of the switching device, and flowing a write current in a second direction between the common source line and a second bit line connected to the second RSE.

5. The array of claim 1, wherein the switching device comprises a metal oxide semiconductor field effect transistor (MOSFET) construction with the common source region characterized as a common n+ doped first region and the multiple drain terminals characterized as a plurality of spaced apart n+ doped second regions, each second region coupled to a respective RSE and separated by a polysilicon gate layer, wherein a shaped conduction channel is respectively formed through the polysilicon gate layer between the first region and each of the second regions.

6. The array of claim 1, wherein each of the RSEs is characterized as a magnetic tunneling junction (MTJ) of a spin-torque transfer random access memory (STRAM).

7. The array of claim 1, wherein each of the RSEs is characterized as a resistive random access memory (RRAM).

8. The array of claim 1, wherein each of the RSEs is characterized as a phase change random access memory (PCRAM).

9. A method comprising:
providing a non-volatile memory cell array comprising a plurality of programmable resistive sense elements (RSEs) coupled to a shared switching device, the switching device comprising a common source region and multiple drain regions each drain region connected to an associated RSE from said plurality of RSEs;
programming a selected RSE from said plurality of RSEs by passing a write current in a selected direction between the common source region to the associated drain region connected to the selected RSE; and
accessing the selected RSE by asserting a common word line connected to a gate terminal of the switching device and directing the write current along a common source line connected to the common source region of the switching device and along a bit line connected to the selected RSE, wherein separate bit lines are individually provided for each of the RSEs.

10. The method of claim 9, wherein the selected RSE is provided with a first resistive state during the programming step by asserting a gate control voltage on the gate terminal of the switching device, and flowing a write current in a first direction between the common source line and a first bit line connected to the first RSE.

11. The memory device of 10, further comprising a step of programming a second selected RSE of said plurality of RSEs to a second resistive state different from the first resistive state by asserting a gate control voltage on the gate terminal of the switching device, and flowing a write current in a second direction between the common source line and a second bit line connected to the second selected RSE.

12. The method of claim 9, wherein the switching device of the providing step comprises a metal oxide semiconductor field effect transistor (MOSFET) construction with the common source region characterized as a common n+ doped first region and the multiple drain regions characterized as a plurality of spaced apart n+ doped second regions, each second region coupled to a respective RSE and separated by a polysilicon gate layer, wherein a shaped conduction channel is formed through the polysilicon gate layer between the first region and a selected one of the second regions during the programming step.

13. The method of claim 9, wherein each of the RSEs is characterized as a magnetic tunneling junction (MTJ) of a spin-torque transfer random access memory (STRAM).

14. The method of claim 9, wherein each of the RSEs is characterized as a resistive random access memory (RRAM).

15. The method of claim 9, wherein each of the RSEs is characterized as a phase change random access memory (PCRAM).

16. The method of claim 9, wherein the switching device of the providing step comprises a plurality of drain terminals separated from the common source terminal and each surrounded by a polysilicon gate, each drain terminal in the plurality of drain terminals connected in series with a corresponding RSE from the plurality of RSEs.

17. A non-volatile memory cell array comprising a plurality of programmable resistive sense elements (RSEs) coupled to a shared switching device, the switching device comprising a common source region and multiple drain regions each drain region connected to an associated RSE from said plurality of RSEs, a selected RSE is accessed by a common word line connected to a gate terminal of the switching device, a common source line connected to the common source region of the switching device, and a plurality of bit lines, each bit line in said plurality of bit lines connected to a corresponding RSE in said plurality of RSEs.

18. The array of claim 17, wherein the common source region is surrounded by a gate that selectively allows access from the source region to one or more drain regions.

19. The array of claim 17, wherein the switching device has at least three drain terminals that are concurrently accessed by the activation of a gate that separates the common source region from the drain regions.

20. The array of claim 17, wherein the plurality of RSEs are arranged as a page of memory and the selected RSE is accessed exclusively by activating only a first bit line of the plurality of bit lines.

* * * * *